(12) United States Patent
Lovatt et al.

(10) Patent No.: US 11,629,241 B2
(45) Date of Patent: Apr. 18, 2023

(54) HYDROLYSIS RESISTANT POLYESTER FILM

(71) Applicant: DuPont Teijin Films U.S. Limited Partnership, Wilmington, DE (US)

(72) Inventors: Allan Lovatt, Middlesbrough (GB); Anthony Whitehead, Middlesbrough (GB); Emily Parnham, Middlesbrough (GB)

(73) Assignee: DuPont Teijin Films U.S. Limited Partnership, Wilmington, DE (US)

( * ) Notice: Subject to any disclaimer, the term of this patent is extended or adjusted under 35 U.S.C. 154(b) by 106 days.

(21) Appl. No.: 16/609,421

(22) PCT Filed: May 8, 2018

(86) PCT No.: PCT/GB2018/051225
§ 371 (c)(1),
(2) Date: Oct. 29, 2019

(87) PCT Pub. No.: WO2018/206929
PCT Pub. Date: Nov. 15, 2018

(65) Prior Publication Data
US 2020/0087488 A1 Mar. 19, 2020

(30) Foreign Application Priority Data
May 8, 2017 (GB) ...................... 1707356

(51) Int. Cl.
| | | |
|---|---|---|
| *C08K 9/04* | (2006.01) | |
| *H01L 31/049* | (2014.01) | |
| *B29C 48/00* | (2019.01) | |
| *B29C 48/08* | (2019.01) | |
| *B29C 48/88* | (2019.01) | |
| *B29C 48/91* | (2019.01) | |
| *B32B 27/20* | (2006.01) | |
| *B32B 27/36* | (2006.01) | |
| *C08J 3/22* | (2006.01) | |
| *C08J 5/18* | (2006.01) | |
| *C08K 3/22* | (2006.01) | |
| *C08K 9/02* | (2006.01) | |
| *H01L 31/048* | (2014.01) | |
| *B32B 27/08* | (2006.01) | |
| *B29K 67/00* | (2006.01) | |

(Continued)

(52) U.S. Cl.
CPC ............ *C08K 9/04* (2013.01); *B29C 48/0018* (2019.02); *B29C 48/022* (2019.02); *B29C 48/08* (2019.02); *B29C 48/91* (2019.02); *B29C 48/9135* (2019.02); *B32B 27/08* (2013.01); *B32B 27/20* (2013.01); *B32B 27/36* (2013.01); *C08J 3/226* (2013.01); *C08J 5/18* (2013.01); *C08K 3/22* (2013.01); *C08K 9/02* (2013.01); *H01L 31/049* (2014.12); *H01L 31/0481* (2013.01); *B29K 2067/00* (2013.01); *B29K 2509/02* (2013.01); *B29L 2007/008* (2013.01); *B32B 2264/102* (2013.01); *B32B 2457/12* (2013.01); *C08J 2367/02* (2013.01); *C08K 2003/2241* (2013.01); *C08K 2201/005* (2013.01); *C08K 2201/019* (2013.01)

(58) Field of Classification Search
CPC ............. C08K 9/04; C08K 3/22; C08K 9/02; C08K 2003/2241; C08K 2201/005; C08K 2201/019; C08K 5/5317; C08K 5/5333; B29C 48/0018; B29C 48/022; B29C 48/08; B29C 48/91; B29C 48/9135; B29C 55/12; B32B 27/08; B32B 27/20; B32B 27/36; B32B 2264/102; B32B 2457/12; B32B 2307/518; C08J 3/226; C08J 5/18; C08J 2367/02; C08J 2467/02; H01L 31/0481; H01L 31/049; H01L 51/42; H01L 51/0097; B29K 2067/00; B29K 2509/02; B29L 2007/008; Y02E 10/549; Y02P 70/50; C08L 67/02
See application file for complete search history.

(56) References Cited

U.S. PATENT DOCUMENTS

| | | |
|---|---|---|
| 3,372,143 A | 3/1968 | Terada et al. |
| 3,657,191 A | 4/1972 | Titzmann et al. |
| 3,869,427 A | 3/1975 | Meschke et al. |

(Continued)

FOREIGN PATENT DOCUMENTS

| | | |
|---|---|---|
| CA | 2514589 A1 | 8/2004 |
| EP | 0 292 251 A2 | 11/1988 |

(Continued)

OTHER PUBLICATIONS

International Search Report and Written Opinion for PCT/GB2018/051225 dated Jul. 9, 2018. 13 pages.
International Preliminary Report on Patentability for PCT/GB2018/051225 dated Jul. 30, 2019. 26 pages.
Search Report for GB App. No. 1707361.0 dated Aug. 14, 2017. 4 pages.
International Search and Written Opinion for PCT/GB2018/051222 dated Aug. 8, 2018. 11 pages.

(Continued)

*Primary Examiner* — Nathan L Van Sell
(74) *Attorney, Agent, or Firm* — Wolf, Greenfield & Sacks, P.C.

(57) ABSTRACT

The use of titanium dioxide particles coated by an organic coating for increasing the hydrolysis resistance of an oriented polyester film, particularly wherein the organic coating does not comprise or is not derived from a silane, and particularly wherein the organic coating is selected from an organophosphorus compound and a polymeric organic coating; and oriented polyester films comprising such titanium dioxide particles coated by an organic coating; and photovoltaic cells comprising such films.

22 Claims, 2 Drawing Sheets

Figure 1:
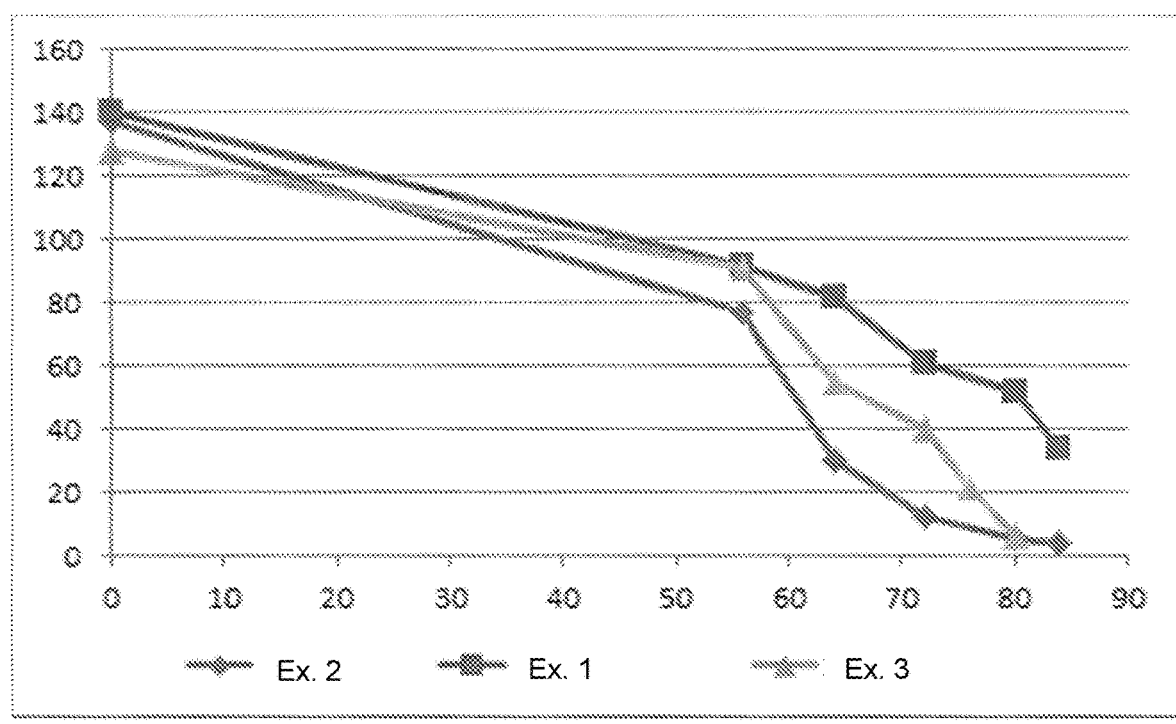

(51) Int. Cl.
  *B29K 509/02* (2006.01)
  *B29L 7/00* (2006.01)

(56) References Cited

U.S. PATENT DOCUMENTS

| | | | |
|---|---|---|---|
| 4,115,350 A | 9/1978 | Lazarus et al. | |
| 4,130,541 A | 12/1978 | Lazarus et al. | |
| 4,540,729 A | 9/1985 | Williams | |
| 5,431,956 A | 7/1995 | Robb et al. | |
| 5,589,126 A | 12/1996 | Shih et al. | |
| 5,837,049 A * | 11/1998 | Watson | C09C 3/08 106/427 |
| 5,885,709 A | 3/1999 | Wick et al. | |
| 6,498,212 B1 | 12/2002 | Kao et al. | |
| 7,229,697 B2 | 6/2007 | Kliesch et al. | |
| 7,232,602 B2 | 6/2007 | Brennan et al. | |
| 7,241,507 B2 | 7/2007 | Kliesch et al. | |
| 7,785,680 B2 | 8/2010 | Brennan et al. | |
| 11,052,641 B2 | 7/2021 | Brennan et al. | |
| 2002/0065346 A1 | 5/2002 | Murschall et al. | |
| 2003/0219614 A1 | 11/2003 | Kliesch et al. | |
| 2005/0003962 A1 | 1/2005 | Brennan et al. | |
| 2005/0137299 A1 | 6/2005 | Berndt | |
| 2007/0237972 A1 | 10/2007 | Kliesch et al. | |
| 2007/0238816 A1 | 10/2007 | Kliesch et al. | |
| 2012/0202083 A1 | 8/2012 | Shiomi et al. | |
| 2013/0108849 A1 * | 5/2013 | Matsumura | B32B 27/20 428/216 |
| 2014/0162051 A1 | 6/2014 | Jesberger et al. | |
| 2020/0070486 A1 | 3/2020 | Ashby et al. | |
| 2020/0189244 A1 | 6/2020 | Brennan et al. | |

FOREIGN PATENT DOCUMENTS

| | | | |
|---|---|---|---|
| EP | 0 572 128 A2 | 12/1993 | |
| EP | 0 620 245 A1 | 10/1994 | |
| EP | 0 707 051 A1 | 4/1996 | |
| EP | 0 738 749 A1 | 10/1996 | |
| EP | 0 838 500 A2 | 4/1998 | |
| EP | 1 114 733 A1 | 7/2001 | |
| EP | 1 209 200 A2 | 5/2002 | |
| EP | 2 926 992 A1 | 10/2015 | |
| EP | 2926992 A1 * | 10/2015 | C08K 3/22 |
| GB | 1048068 A | 11/1966 | |
| JP | H04-7336 A | 1/1992 | |
| JP | H06-80798 A | 3/1994 | |
| JP | 2011-068756 A | 4/2011 | |
| JP | 2014-040540 A | 3/2014 | |
| WO | WO 97/11847 A1 | 4/1997 | |
| WO | WO 97/37849 A1 | 10/1997 | |
| WO | WO 01/53391 A1 | 7/2001 | |
| WO | WO 2011/030098 A1 | 3/2011 | |
| WO | WO 2012/104668 A1 | 8/2012 | |
| WO | WO 2012/120260 A1 | 9/2012 | |
| WO | WO 2014/041827 A1 | 3/2014 | |
| WO | WO 2016/005746 A1 | 1/2016 | |
| WO | WO 2016/146982 A1 | 9/2016 | |

OTHER PUBLICATIONS

International Search Report and Written Opinion for PCT/GB2018/051223 dated Aug. 10, 2018. 12 pages.

International Preliminary Report on Patentability for PCT/GB2018/051223 dated Aug. 27, 2019. 11 pages.

International Preliminary Report on Patentability (Chapter II) for PCT/GB2018/051222 dated Nov. 8, 2019. 26 pages.

[No Author Listed], Organic chemistry. Wikipedia. Mar. 8, 2022. https://en.wikipedia.org/wiki/Organic_chemistry [last accessed Mar. 18, 2022] 4 pages.

[No Author Listed], Organic Compounds. Medicine LibreTexts. Aug. 13, 2020. https://med.libretexts.org/Bookshelves/Anatomy_and_Physiology/Book%3A_Human_Anatomy_and_Physiology_Preparatory_Course_(Liachovitzky)/03%3A_Molecular_Level-_Biomolecules_the_Organic_Compounds_Associated_With_Living_Organisms/3.01%3A_Organic_Compounds#:~:text=Organic%20compounds%20are%20molecules%20that,chain%20(a%20hydrocarbon%20backbone). [last accessed Mar. 18, 2022] 2 pages.

[No Author Listed], Organic phosphonic acids and derivatives. Fisher Scientific. https://www.fishersci.com/us/en/browse/80013800/organic-phosphonic-acids-and-derivatives. 6 pages, Date Accessed: 2022.

* cited by examiner

HYDROLYSIS RESISTANT POLYESTER FILM

CROSS-REFERENCE TO RELATED APPLICATIONS

This application is a U.S. National Stage patent application based on International Patent Application Serial No. PCT/GB2018/051225, filed May 8, 2018, which claims the benefit of United Kingdom Application No. GB 1707356.0, filed May 8, 2017, each of which is hereby incorporated herein by reference in its entirety.

The present invention is concerned with polyester films which exhibit improved hydrolysis resistance, and with a process for the production thereof.

The advantageous mechanical properties, dimensional stability and optical properties of polyester films are well-known. However, polyester films are susceptible to hydrolytic degradation, which results in a reduction in the intrinsic viscosity of the polymer, and a consequent deterioration in one or more of the afore-mentioned desirable properties of the film, particularly the mechanical properties. Poor hydrolytic stability can also manifest itself by the cracking of the film. Poor hydrolysis resistance is a particular problem when the film is exposed to humid conditions and/or elevated temperatures, and particularly on prolonged exposure over an extended period of time, for instance in exterior applications such as in photovoltaic (PV) cells.

In order to improve the hydrolysis resistance of polyester films, it is known to incorporate organic hydrolysis stabilisers into the film. For instance, the addition of carbodiimides as end-capping agents in polyester compositions was proposed in U.S. Pat. No. 5,885,709 and EP-0838500, amongst others, but such additives have a tendency to emit harmful gaseous by-products. US-2003/0219614-A1 reports that the use of polymeric carbodiimides as the hydrolysis stabilisers reduces the tendency for gas evolution. US-2002/0065346-A1 teaches hydrolysis stabilisers selected from a phenolic compound, an oxazoline and/or a monomeric or polymeric carbodiimide, optionally combined with an organic phosphite. GB-1048068 teaches the use of copper salts of organic carboxylic acids as hydrolysis stabilisers. U.S. Pat. Nos. 3,657,191 and 3,869,427 teach the modification of the terminal groups of the polyester by reaction with ethylene carbonates or monofunctional glycidyl ethers. Hydrolysis-resistant polyesters stabilised by the use of terminal epoxy group-containing compounds are also disclosed in EP-0292251-A. In EP-1209200 it is reported that a combination of a glycidyl ester and a glycidyl ether in the presence of a catalyst which promotes reaction between glycidyl and carboxyl groups improves the hydrolysis resistance of polyesters, although that disclosure is directed to polybutylene terephthalate (PBT), which crystallises much faster than PET, and its use in the manufacture of injection-moulded materials. U.S. Pat. No. 6,498,212 discloses polyesters in which hydrolytic stability has been improved by the use of a polymeric end-capping agent selected from epoxy-ethylene-ethyl acrylate copolymers, epoxystyrene-butadiene-styrene block copolymers and aminopolyethylene copolymers. The use of epoxidised fatty acid alkyl esters (such as epoxidised stearic acid 2-ethyl-hexyl ester) and/or epoxidised fatty acid glycerides (such as epoxidised soybean or linseed oil) as hydrolysis stabilisers in polyester compositions is disclosed in CA-2514589-A, U.S. Pat. Nos. 4,540, 729, 5,589,126, 7,229,697, 7,241507, 2005/0137299-A1, US-2007/0238816-A1 and US-2007/0237972-A1. Other methods of improving hydrolytic stability of polyethylene terephthalate (PET) films include the simultaneous control of parameters such as intrinsic viscosity, diethylene glycol content and crystallinity, as disclosed in EP-0738749-A. The control of intrinsic viscosity and crystallinity, in combination with the presence of an antioxidant, is reported in EP-0620245-A as improving high-temperature (180° C.) ageing characteristics without detriment to in-plane delamination properties for polyester films used as insulator materials in electric motors and capacitors. U.S. Pat. Nos. 4,115, 350 and 4,130,541 teach that the reaction product of polyesters with epoxidised alkyl esters of mono-carboxylic acids, amides and thio-acids improves the thermal stability of the polyester in fibres and cords made therefrom. U.S. Pat. No. 3,372,143 teaches that the reaction product of polyesters with epoxidised alkoxy- or aryloxy-ethers improves the dyeability of fibres made therefrom. WO-2011/030098-A and WO-2012/120260-A teach the use in polyethylene terephthalate (PET) films of hydrolysis stabilisers selected from glycidyl esters of a branched monocarboxylic acid having from 5 to 50 carbon atoms wherein the hydrolysis stabiliser is present in the film in the form of its reaction product with at least some of the end-groups of the polyester.

One of the problems associated with the incorporation of organic hydrolysis stabilisers into polyester films is that while increasing the concentration of the additive can improve the hydrolysis resistance, it may do so at the expense of a reduction in the melting point and/or intrinsic viscosity, and a deterioration in the mechanical properties of the polyester film, so that the film can become brittle and film formation can become difficult. Thus, a particular consequence of a reduction in mechanical properties is that the processability of the filmed polyester becomes poor, and breakage of the film web occurs during manufacture and subsequent processing.

Another problem observed with organic hydrolysis stabilisers is that the film can become discoloured and exhibit imperfections. This is a particular problem for hydrolysis stabilisers based on epoxidised fatty acid glycerides and multi-functional glycidyl compounds. Such reduction in the film quality is problematic in itself and also has consequences for processability. Such additives can induce profile defects and unacceptable levels of die-lines in polyester films, i.e. poor uniformity in thickness and/or light transmission across the film web, and the extrudate can become impossible to process on a film-line because of breakage of the film web. It is believed that such problems are at least partly attributable to cross-linking and gel formation, which interferes with the stretching process experienced by the film during its manufacture. A further problem with using multi-functional glycidyl compounds as hydrolysis stabilisers for polyester is that their higher rate of chain extension of the polyester increases melt viscosity, which in turn reduces the extrusion output at a given temperature, and this is economically undesirable. While viscosity could theoretically then be reduced by increasing melt temperatures, this would lead to increased rates of degradation of the polymer and hydrolysis stabiliser and cause gel formation.

Gel formation is much less problematic in the manufacture of other polyester products, such as injection moulded PBT products, in part because of the much greater thickness of those products compared to polyester film.

Another problem with the organic hydrolysis stabilisers based on epoxidised fatty acids, particularly epoxidised fatty acid glycerides, is that such additives have a tendency to decompose during film manufacturing and processing with evolution of acrolein, a highly toxic, flammable and foul-smelling substance.

It is an object of this invention to provide alternative hydrolysis resistant polyester films, particularly wherein the use of an organic hydrolysis stabiliser is avoided, particularly wherein the film may be manufactured and used without the evolution of toxic by-products, particularly while maintaining or improving the ease and efficiency and economy of film manufacture without increasing film breakage, particularly wherein the level of die-lines and profile defects is reduced, and particularly without detriment to the mechanical and/or optical properties of the film.

It is a further object of this invention to provide improved hydrolysis resistant polyester films which do not contain an organic hydrolysis stabiliser or which are manufactured without an organic hydrolysis stabiliser, i.e. wherein the hydrolysis resistance is increased relative to other or conventional hydrolysis resistant polyester films which do not contain or which are manufactured without an organic hydrolysis stabiliser, and particularly while maintaining or improving the ease and efficiency and economy of film manufacture without increasing film breakage, particularly wherein the level of die-lines and profile defects is reduced, and particularly without detriment to the mechanical and/or optical properties of the film.

According to the present invention, there is provided an oriented polyester film comprising titanium dioxide particles wherein said particles are coated by an organic coating The present inventors have unexpectedly found that titanium dioxide particles coated by said organic coating confer surprisingly good hydrolysis resistance to polyester films, and superior to conventional titanium dioxide particles typically used in polyester films. Moreover, titanium dioxide particles coated by said organic coating can provide adequate hydrolysis resistance to polyester films in the absence of conventional organic hydrolysis stabilisers typically added to polyester films.

The oriented polyester film described herein is a self-supporting film or sheet by which is meant a film or sheet capable of independent existence in the absence of a supporting base. The film is preferably uniaxially or biaxially oriented, preferably biaxially oriented.

The polyester(s) which constitute the film is/are typically synthetic linear polyester(s). Suitable polyesters are obtainable by condensing one or more dicarboxylic acid(s) or their lower alkyl (up to 6 carbon atoms) diesters with one or more diols. The dicarboxylic acid component contains at least one aromatic dicarboxylic acid, which is preferably terephthalic acid, isophthalic acid, phthalic acid, 1,4-, 2,5-, 2,6- or 2,7-naphthalenedicarboxylic acid, and is preferably terephthalic acid (TA) or 2,6-naphthalenedicarboxylic acid, and preferably terephthalic acid. The polyester may also contain one or more residues derived from other dicarboxylic acids such as 4,4'-diphenyldicarboxylic acid, hexahydro-terephthalic acid, 1,10-decanedicarboxylic acid, aliphatic dicarboxylic acids including those of the general formula $C_nH_{2n}$(COOH)$_2$ wherein n is 2 to 8 (such as succinic acid, glutaric acid, sebacic acid, adipic acid, azelaic acid, suberic acid or pimelic acid, preferably sebacic acid, adipic acid and azelaic acid, and more preferably azelaic acid). The diols are preferably selected from aliphatic and cycloaliphatic glycols, e.g. ethylene glycol (EG), 1,3-propanediol, 1,4-butanediol and 1,4-cyclohexanedimethanol (CHDM), and preferably from ethylene glycol (EG). The film-forming polyester resin is the major component of the film, and makes up at least 50% by weight of the total weight of a given layer, preferably at least 65%, typically at least 80%, more typically at least 85%, and in one embodiment typically at least 95% by weight of the total weight of a given layer.

The polyester is preferably a crystallisable polyester. Preferably the polyester contains only one dicarboxylic acid, preferably an aromatic dicarboxylic acid, preferably terephthalic acid or 2,6-naphthalenedicarboxylic acid, and preferably terephthalic acid. Preferably the polyester contains only one glycol, preferably an aliphatic glycol, preferably ethylene glycol. Preferably the polyester contains one aromatic dicarboxylic acid and one aliphatic glycol. Polyethylene terephthalate (PET) or polyethylene 2,6-naphthalate (PEN), particularly PET, is the preferred polyester of the base layer. The polyester may optionally contain relatively minor amounts of one or more residues derived from the other dicarboxylic acids and/or diols described above, and where such minor amounts are present then the total amount of said other dicarboxylic acid(s) is preferably less than 10 mol %, preferably less than 5 mol %, preferably less than 1 mol % of the total dicarboxylic acid fraction of the polyester of a given layer and/or the total amount of said other diol(s) is preferably less than 15 mol %, preferably less than 10 mol %, preferably less than 5 mol % of the total diol fraction of the polyester of a given layer. The polyester is the major component of a given layer and makes up at least 50% by weight of the total weight of the layer, preferably at least 65%, preferably at least 80%, more preferably at least 85% by weight of the total weight of a given layer, and in one embodiment typically at least 95% by weight of the total weight of a given layer.

The intrinsic viscosity of the polyester from which a given layer of the film is derived is preferably at least about 0.60 preferably at least about 0.65, preferably at least about 0.70. Preferably, the intrinsic viscosity of the polyester is not more than about 0.80, typically not more than 0.75. Preferably, the intrinsic viscosity of the polyester is at least 0.61, preferably at least about 0.62, preferably at least about 0.63. The use of polyesters with a relatively higher intrinsic viscosity provides improved hydrolysis stability, although too high a viscosity can lead to difficulties in film manufacture and/or require specialised, more robust film-forming equipment. For instance, increasing the viscosity too greatly may mean that it is appropriate to reduce output (i.e. reduce the amount of polyester extruded per unit time, which leads to a less economical process) or to increase the extrusion temperature in order to reduce the viscosity of the melt (which in turn can lead to thermal degradation of the polymer and the loss of associated properties) in order to achieve stable film production.

Formation of the polyester is conveniently effected in a known manner by condensation or ester interchange, generally at temperatures up to about 295° C. In a preferred embodiment, solid state polymerisation may be used to increase the intrinsic viscosity of crystallisable polyesters to the desired value, using conventional techniques well-known in the art, for instance using a fluidised bed such as a nitrogen fluidised bed or a vacuum fluidised bed using a rotary vacuum drier. In the following description of polymer and film manufacture, it will be understood that the term "polyester" includes "copolyester".

Formation of the polyester film of the present invention may be effected by conventional techniques. The extrusion is generally carried out at a temperature within the range of from about 250 to about 300° C., and is followed by quenching the extrudate and orienting the quenched extrudate. Preferably the polyester is extruded at a temperature of from about 270 to about 300° C., preferably from about 280 to about 300° C.

The multilayer films of the present invention may be produced using conventional techniques in the art, including co-extrusion, lamination and coating techniques well-known in the art, and most preferably by co-extrusion. In general terms the co-extrusion process comprises the steps of co-extruding the respective polyester compositions through independent orifices of a multi-orifice die, and thereafter uniting the still molten layers or, preferably, by single-channel co-extrusion in which molten streams of the respective polyesters are first united within a channel leading to a die manifold, and thereafter extruded together from the die orifice under conditions of streamline flow without inter-mixing thereby to produce a laminated film.

Orientation of the quenched extrudate may be effected by any process known in the art for producing an oriented film, for example a tubular or flat film process. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the Tg of the polyester, preferably about 15° C. higher than the Tg. Greater draw ratios (for example, up to about 8 times) may be used if orientation in only one direction is required. It is not necessary to stretch equally in the machine and transverse directions although this is preferred if balanced properties are desired.

The stretched film may be, and preferably is, dimensionally stabilised by heat-setting under dimensional support at a temperature above the glass transition temperature of the polyester but below the melting temperature thereof, to induce the desired crystallisation of the polyester. During the heat-setting, a small amount of dimensional relaxation may be performed in the transverse direction (TD) by a procedure known as "toe-in". Toe-in can involve dimensional shrinkage of the order 2 to 4% but an analogous dimensional relaxation in the process or machine direction (MD) is difficult to achieve since low line tensions are required and film control and winding becomes problematic. The actual heat-set temperature and time will vary depending on the composition of the film and its desired final thermal shrinkage but should not be selected so as to substantially degrade the toughness properties of the film such as tear resistance. Within these constraints, a heat set temperature of about 180 to 245° C. is generally desirable. In one embodiment, the heat-set-temperature is within the range of from about 200 to about 225° C., which provides advantageous improvements in hydrolytic stability. After heat-setting the film is typically quenched rapidly in order induce the desired crystallinity of the polyester.

The film may be further stabilized through use of an in-line relaxation stage. Alternatively the relaxation treatment can be performed off-line. In this additional step, the film is heated at a temperature lower than that of the heat-setting stage, and with a much reduced MD and TD tension. The tension experienced by the film is a low tension and typically less than 5 kg/m, preferably less than 3.5 kg/m, more preferably in the range of from 1 to about 2.5 kg/m, and typically in the range of 1.5 to 2 kg/m of film width. For a relaxation process which controls the film speed, the reduction in film speed (and therefore the strain relaxation) is typically in the range 0 to 2.5%, preferably 0.5 to 2.0%. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135 to 250° C. is generally desirable, preferably 150 to 230° C., more preferably 170 to 200° C. The duration of heating will depend on the temperature used but is typically in the range of 10 to 40 seconds, with a duration of 20 to 30 seconds being preferred. This heat stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation.

The polyester film of the present invention preferably comprises from about 1 wt % to about 40 wt %, preferably from about 1 wt % to about 20 wt %, preferably from about 5 wt % to about 20 wt %, or from about 10 wt % to about 20 wt %, of said titanium dioxide particles coated by an organic coating, by total weight of the film.

In one preferred embodiment, the polyester film polyester film is a multilayer film comprising a first polyester layer (A) and a second polyester layer (B). Each of the polyesters of the first layer (A) and the second layer (B) are independently selected from the polyester described hereinabove. Preferably, the polyester of said second layer (B) is or comprises a polyester which is the same as the polyester of said first layer (A). In the preferred use in PV cells (particularly the back-plane thereof) described herein, the first polyester layer (A) is preferably the layer which is the outermost layer in the PV cell.

In this multilayer film embodiment, preferably at least the first polyester layer (A) comprises said titanium dioxide particles coated by an organic coating, and preferably said second polyester layer (B) also comprises said titanium dioxide particles coated by an organic coating. Polyester layer (A) preferably comprises from about 1 wt % to about 40 wt %, preferably from about 1 wt % to about 20 wt %, preferably from about 10 wt % to about 20 wt %, of said titanium dioxide particles coated by an organic coating, by total weight of the layer. Preferably, said second layer (B) comprises said titanium dioxide particles coated by an organic coating, preferably in an amount of from about 1 wt % to about 10 wt %, preferably from about 1 wt % to about 5 wt %, by total weight of the layer. Preferably, the amount of said titanium dioxide particles coated by an organic coating in layer (A) is greater than the amount titanium dioxide particles coated by an organic coating in layer (B).

In this multilayer film embodiment, preferably said second layer (B) comprises reclaimed waste film derived from the manufacture of said multilayer film.

In this multilayer film embodiment, preferably the thickness of layer (A) is less than the thickness of layer (B), preferably wherein the thickness of layer (A) is from about 10% to about 40%, preferably from about 20% to about 30%, of the thickness of layer (B).

Where the polyester film of the present invention comprises a single polyester layer (particularly a single titanium dioxide-containing layer), the film preferably comprises from about 1 wt % to about 40 wt %, preferably from about 1 wt % to about 20 wt %, preferably from about 5 wt % to about 20 wt %, and preferably from about 10 wt % to about 20 wt %, of said titanium dioxide particles coated by an organic coating, by total weight of the film.

The polyester films described herein preferably have a total film thickness from about 12 µm to about 500 µm, preferably from about 12 to about 350 µm, preferably from about 12 to about 250 µm, preferably from about 20 to about 100 µm.

In the polyester films described herein, the titanium dioxide is preferably in the rutile crystal form.

The organic coating is preferably coated uniformly on said titanium dioxide particles. The organic coating is preferably coated discretely on said titanium dioxide particles. The organic material which coats the titanium dioxide particles is thus suitably a film-forming organic material.

Preferably, the organic coating does not comprise or is not derived from a silane.

The organic coating is not, and preferably does not comprise, a polysiloxane.

In a first preferred embodiment (referred to herein as Embodiment A), the organic coating is an organophosphorus compound.

Preferably, the titanium dioxide particles are coated with an alkylphosphonic acid or an ester of an alkylphosphonic acid wherein the alkylphosphonic acid contains from 6 to 22 carbon atoms.

The alkylphosphonic acid or ester thereof is preferably represented by the formula $P(R)(=O)(OR^1)(OR^2)$, wherein:

R is an alkyl group or a cycloalkyl group containing 6 to 22 carbon atoms; and $R^1$ and $R^2$ are each hydrogen, an alkyl group, a cycloalkyl group, an aryl group or an aralkyl group.

When W and $R^2$ are both hydrogen, the compound is an alkylphosphonic acid. When at least one of $R^1$ and $R^2$ is a hydrocarbyl group the formula represents an ester of an alkylphosphonic acid.

Preferably, R contains from 6 to 14 carbon atoms.

Preferably, R is a straight chain alkyl group. However, branched chain alkylphosphonic acids and their esters are also suitable.

In the case of the esters, $R^1$ and $R^2$ are preferably independently selected from an alkyl group, a cycloalkyl group, an aryl group or an aralkyl group containing up to 10 carbon atoms and more preferably up to 8 carbon atoms (i.e. the ester is an ester of an alcohol containing up to 10, and preferably up to 8 carbon atoms). $R^1$ and $R^2$ are preferably hydrocarbyl groups. Where $R^1$ and $R^2$ is aryl or aralkyl, the aryl group is preferably phenyl.

$R^1$ and $R^2$ can be different but are typically the same. Preferably $R^1$ and $R^2$ are hydrogen.

Particularly suitable esters include ethyl esters, butyl esters, octyl esters, cyclohexyl esters and phenyl esters.

Particularly preferred phosphorus compounds include n-octylphosphonic acid and its esters, n-decylphosphonic acid and its esters, 2-ethylhexylphosphonic acid and its esters and camphyl phosphonic acid and its esters.

Coated particles according to Embodiment A may be prepared using the processes taught in EP-0707051-A, the process of manufacture of which is incorporated herein by reference.

In a further preferred embodiment (referred to herein as Embodiment B), the organic coating is a polymeric organic coating.

The polymeric backbone of a polymeric organic coating preferably does not contain silicon atoms.

A polymeric organic coating is preferably derived from monomers containing carbon, hydrogen and oxygen atoms, and optionally further comprising nitrogen and/or phosphorus and/or sulphur atoms. Thus, it will be appreciated that the polymeric organic coating is preferably derived from monomers which do not contain silicon atoms.

The coated titanium dioxide particles coated by a polymeric organic coating are preferably obtained by dispersing titanium dioxide particles in water at a pH value higher than the isoelectric point of said titanium dioxide particles (and preferably at a pH above 7 and preferably at a pH of 9 to 11) in the presence of a dispersing agent comprising a polymeric polybasic acid or a salt thereof to produce particles having a modified isoelectric point; adjusting the pH of the dispersion to a value below 9 but above the modified isoelectric point of the particles; and polymerising in the presence of the dispersion so produced one or more ethylenically unsaturated monomer(s) so that said titanium dioxide particles are coated with polymerised monomer. Preferably the particles are manufactured in accordance with the disclosure of EP-0572128-A, the disclosure of which is incorporated herein, and particularly the disclosure of the process of manufacture of the coated particles is incorporated herein.

Without being bound by theory, it is believed that the coated titanium dioxide particles comprise a coherent inner coating formed from the dispersing agent and an outer coating formed from the polymerisation of one or more ethylenically unsaturated monomer(s) and/or the dispersing agent is incorporated into the polymeric coating during polymerisation of the ethylenically unsaturated monomer(s).

The polymeric polybasic acids are preferably selected from polysulphonic acids, polyphosphonic acids and polycarboxylic acids, and preferably from polycarboxylic acids, or salts thereof. When the polymeric polybasic acids are in salt form, the acids may be partially or fully neutralised. Suitable salts are the alkali metal salts or ammonium salts.

Suitable polysulphonic acids are preferably selected from lignosulphonates, petroleum sulphonates and poly(styrene sulphonates), including poly(sodium 4-styrene sulphonate).

Suitable polycarboxylic acids are preferably selected from polymaleic acids, polyacrylic acids, substituted acrylic acid polymers, acrylic copolymers, including copolymers of an acrylic acid with sulphonic acid derivatives, including 2-acrylamido and 2-methyl propane sulphonic acid. Other comonomers polymerisable with the acrylic acid or the substituted acrylic acid may contain a carboxyl group.

Preferably, the dispersing agents exhibit a molecular weight (Mw) of from about 1,000 to about 10,000. Preferably, the dispersing agents are substantially linear molecules. Molecular weight determination may be conducted on a Hewlett-Packard 1050 Series HPLC system equipped with two GPC Ultrastyragel columns, $10^3$ and $10^4$ Å (5 µm mixed, 300 mm×19 mm, Waters Millipore Corporation, Milford, Mass., USA) and THF as mobile phase. The molecular weight is calculated by comparison with the retention times of polystyrene standards.

Preferably, the amount of dispersing agent is from about 0.05 to about 5.0 wt %, preferably from about 0.1 to about 1.0 wt %, by weight of the titanium dioxide particle, i.e. the core, uncoated titanium dioxide particle prior to treatment with the dispersing agent and polymerisable coating monomer(s).

Preferably the polymeric organic coating comprises a polymer derived from one or more ethylenically unsaturated monomer(s). In other words, the polymeric organic coating comprises a polymer derived from the polymerisation of one or more ethylenically unsaturated monomer(s).

The ethylenically unsaturated monomer(s) are preferably polymerisable in aqueous solvents, preferably wherein the polymer produced is insoluble in water and optionally cross-linked by a cross-linking agent.

The ethylenically unsaturated monomer(s) are preferably selected from aliphatic and aromatic compounds containing a polymerisable unsaturated group, preferably wherein the polymerisable unsaturated group is selected from unsaturated carboxylic acids and unsaturated carboxylic acid esters.

The ethylenically unsaturated monomer(s) are preferably acidic monomers selected from acrylic acid, methacrylic acid, itaconic acid, maleic acid or its anhydride, fumaric acid and crotonic acid, and esters of said acidic monomers, including methyl acrylate, ethyl acrylate, methyl methacrylate, butyl acrylate and ethyl methacrylate. The ethylenically unsaturated monomer may also be selected from styrene, vinyl toluene, alpha methylstyrene, ethylene, vinyl acetate, vinyl chloride, acrylonitrile, and fluorinated monomers including fluorinated alkenes, fluorinated ethers, fluorinated acrylic and methacrylic acids and esters thereof and fluorinated heterocyclic compounds. Preferably, the ethylenically unsaturated monomer(s) are selected from unsaturated carboxylic acids and unsaturated carboxylic acid esters, preferably from methyl acrylate, ethyl acrylate, butyl acrylate, butyl methacrylate, vinyl acetate and vinyl isobutylether.

The polymeric organic coating may be cross-linked, preferably by virtue of the presence of one or more cross-linking agent(s), preferably wherein the cross-linking agent is selected from di- and poly-functional ethylenically unsaturated monomers, preferably from ethylene glycol dimethacrylate, ethylene glycol diacrylate, allyl methacrylate, allyl acrylate, 1,3-butanediol diacrylate, divinyl benzene and 1,3-butanediol dimethacrylate, preferably wherein said cross-linking agent in an amount of from about 1 wt % to about 20 wt %, preferably from about 1 wt % to about 10 wt %, based on the total weight of the ethylenically unsaturated monomer(s)

Preferably, the organic coating is selected from the organic coating described hereinabove for Embodiment A.

The organic coating is preferably present in an amount of from about 0.1 to about 200 wt %, preferably from about 0.1 to about 100 wt %, from about 0.5 to about 100 wt %, from about 2.0 to about 20 wt %, by weight of the titanium dioxide. Preferably, the volume ratio of the titanium dioxide particle particles to the organic coating is from 1:1 to 1:25 by volume, and preferably from 1:2 to 1:8.

The titanium dioxide preferably has a water content such that it exhibits a loss at 290° C. of no greater than 1.0%, preferably no greater than 0.5%.

The organic coated titanium dioxide is preferably not hydrophobic. Preferably the organic coated titanium dioxide coating is hydrophilic.

The titanium dioxide particles preferably also carry an inorganic coating, particularly a silica and/or alumina coating, preferably an alumina coating, wherein the organic coating is applied subsequently to the application of the inorganic coating on to the underlying titanium dioxide core.

The coated titanium dioxide particles preferably exhibit a particle size such that the volume distributed median particle diameter (equivalent spherical diameter corresponding to 50% of the volume of all the particles, read on the cumulative distribution curve relating volume % to the diameter of the particles—often referred to as the "D(v,0.5)" value) thereof is preferably in the range from 0.01 to 5.0 µm, more preferably 0.05 to 1.0 µm, more preferably 0.05 to 0.40 µm, preferably from 0.10 to 0.25 µm, preferably from 0.15 to 0.25 µm. Preferably at least 90%, more preferably at least 95% by volume of the particles are within the range of the volume distributed median particle diameter±0.8 µm, and particularly ±0.5 µm. Particle size of the particles may be measured by electron microscope, coulter counter, sedimentation analysis and static or dynamic light scattering. Techniques based on laser light diffraction (Fraunhofer diffraction) are preferred. A particularly preferred method utilises a Mastersizer (e.g. a 3000) available from Malvern. The median particle size may be determined by plotting a cumulative distribution curve representing the percentage of particle volume below chosen particle sizes and measuring the 50th percentile.

The film may further comprise other additives conventionally employed in the manufacture of polyester films. Thus, additives such as cross-linking agents, dyes, pigments, voiding agents, lubricants, antioxidants, radical scavengers, thermal stabilisers, flame retardants and inhibitors, anti-blocking agents, surface active agents, slip aids, gloss improvers, prodegradents, viscosity modifiers and dispersion stabilisers may be incorporated as appropriate. Such components may be introduced into the polymer in a conventional manner. For example, by mixing with the monomeric reactants from which the film-forming polymer is derived, or the components may be mixed with the polymer by tumble or dry blending or by compounding in an extruder, followed by cooling and, usually, comminution into granules or chips. Masterbatching technology as described above may also be employed.

It is preferred, however, that the films do not comprise an organic hydrolysis stabiliser.

It is also preferred that the films do not comprise an organic UV absorber, such as a benzophenone, benzotriazole, benzoxazinone or triazine.

The intrinsic viscosity of the polyester film is preferably at least about 0.60, preferably at least about 0.61, preferably at least about 0.62, preferably at least about 0.63, preferably at least about 0.64, preferably at least about 0.65, and typically in the range of from about 0.60 to about 0.70.

The use of polyester films with a relatively high intrinsic viscosity provides improved hydrolysis stability.

The hydrolysis resistance of the film is assess by measuring the tensile strength (brittleness) of the film, in particular by measuring the elongation to break (ETB) of the film, as described hereinbelow. An ETB value of over 100% is typically exhibited by a film which has not been aged. In general, a film remains useful in its end-use up to the time at which its ETB is reduced to less than 10%. The preferred films of the present invention exhibit a hydrolysis resistance such that the ETB is at least 10%, preferably at least 20%, preferably at least 30%, after accelerated ageing at 121° C. and 100% relative humidity for at least 80 hours, preferably at least 84 hours, and preferably at least 90 hours.

In one embodiment, the polyester of the polyester film exhibits an endothermic high temperature peak at a temperature of (A)° C. and an endothermic low temperature peak at a temperature of (B)° C., both peaks being measured by differential scanning calorimetry (DSC), wherein the value of (A-B) is in the range from 15° C. to 50° C., preferably in the range from 15° C. to 45° C., more preferably in the range from 15° C. to 40° C., and in one embodiment in the range from 20° C. to 40° C., and this characteristic may be achieved as disclosed herein by control of the heat-setting temperature using the preferred temperatures described hereinabove. The advantage of exhibiting (A-B) values within the ranges disclosed herein is that an advantageous improvement in hydrolytic stability is obtained.

The polyester film of the invention preferably exhibits a low shrinkage, preferably less than 3%, preferably less than 2%, preferably less than 1.5%, and preferably less than 1.0% at 150° C. over 30 minutes, particularly in the machine (longitudinal dimension) of the film. Preferably such low shrinkage values are exhibited in both dimensions of the film (i.e. the longitudinal and transverse dimensions).

In a preferred embodiment, the film is opaque, and such films are of particular use as the back-plane in a PV-cell. An opaque film preferably exhibits a Transmission Optical Density (TOD) of at least 0.4, preferably at least 0.5, preferably at least 0.6, preferably at least 0.7, preferably at least 1.0 and preferably at least 1.5, and in one embodiment preferably at least 2.0, preferably at least 3.0, and preferably at least 4.0. Opacity is typically provided by one or more suitable opacifying agent(s) and/or whitening agent(s), as is conventional in the art. The coated titanium dioxide particles described hereinabove may, and preferably do, function as the opacifying agent and/or whitening agent. Optionally, however, the film may further comprise one or more additional opacifying agent(s) and/or whitening agent(s). An opaque film may be pigmented as required. For instance, the film of the invention may be white, grey or black.

In a preferred embodiment, the film is white, which may be effected by incorporation therein of an effective amount of a whitening agent. The coated titanium dioxide particles described hereinabove may, and preferably do, function as the whitening agent. Optionally, however, the film may further comprise one or more additional whitening agent(s). Additional suitable whitening agents include a particulate inorganic filler selected from, for example, metal or metalloid oxides such as alumina, talc and silica (especially precipitated or diatomaceous silica and silica gels), calcined china clay and alkaline metal salts, such as the carbonates and sulphates of calcium and barium. Other suitable additional whitening agents include an incompatible resin filler. A mixture of such fillers may be used. A preferred additional whitening agent is a particulate inorganic filler, preferably barium sulphate. The total amount of whitening agent incorporated into the film (or a layer thereof) is preferably in the range of from about 1% to about 40%, typically from about 5% to about 30%, more typically from about 8% to about 25% by weight, based on the weight of polyester in the film (or layer thereof). A white film preferably exhibits a whiteness index, measured as herein described, in the range of from about 80 to about 120 units. A white film typically exhibits a TOD in the range from 0.4 to 1.75, preferably at least 0.5, preferably at least 0.6, preferably at least 0.7.

In an alternative embodiment, the film is grey or black, typically exhibiting a TOD of at least 2.0, more typically at least 3.0, more typically at least 4.0, and this may be achieved by incorporation therein of an effective amount of an opacifying agent such as carbon black, or a metallic filler such as aluminium powder, as is conventional in the art. Carbon black is a preferred opacifying agent. Typically, such a film comprises in the range of from about 0.3% to about 10%, preferably 0.5% to 7%, particularly 1% to 5%, and especially 2% to 4% of opacifying agent, by weight based on the weight of the polyester. The opacifying agent may be present in more than one layer, or in each layer, of a multilayer film or in only one layer thereof. The opacifying agent suitably has a particle diameter (defined and measured as described hereinabove) in the range from 0.01 to 1.5 µm, particularly 0.02 to 0.05 µm.

The polyester film of the present invention exhibits a high level of film uniformity and quality, as well as excellent resistance to hydrolytic degradation. In particular, the films of the present invention have a low level profile defects and/or die-lines, uniform thickness and light transmission properties, and excellent processability, with no defects or breakage in the film web.

The films of the present invention are particularly suitable for use in photovoltaic (PV) cells. As noted above, a photovoltaic cell is a multilayer assembly typically comprising a front-plane (or front-sheet); a front-side encapsulant material; electrode and photovoltaic-active layers (wherein the photoactive material is normally supported on an electrode support substrate); a rear-side encapsulant; and a back-plane (or back-sheet). A typical PV cell further comprises various components to collect and manage the electrical charge. Polyester films have been proposed in the manufacture of various layers in PV cells, for instance the front-plane, the back-plane, and the electrode support layer(s). Photovoltaic modules, often consisting of many photovoltaic cells, are usually categorized according to the active photovoltaic materials used. These include crystalline silicon, gallium-arsenide (GaAs), amorphous silicon (a-Si), cadmium-telluride (CdTe), copper-indium-gallium-(di)selenide (CIGS), dye-sensitized or organic cells. Photovoltaic cells containing gallium-arsenide, amorphous silicon, cadmium-telluride, copper-indium-gallium-(di)selenide, dye-sensitized or conductive organic material are often referred to as thin-film photovoltaic cells (TFPV cells), which may or may not be flexible. Dye-sensitised PV cells are of particular interest, in which the active light-absorbing layer comprises a dye which is excited by absorbing incident light. Other thin-film silicon PV cells include protocrystalline, nanocrystalline (nc-Si or nc-Si:H) and black silicon PV cells. Thin-film photovoltaic cells are made by depositing one or more thin layers of photovoltaic material on a substrate, the thickness range of a thin layer varying from 1 or 2 nanometers to tens of micrometers, using a variety of deposition methods and a variety of substrates. The encapsulant material is a barrier material which protects the photoactive and electrode layers and provides high resistance to gas and solvent permeation.

The encapsulating barrier material is typically utilised in the form of a self-supporting film or sheet, which is applied to the composite comprising photoactive and electrode layers using lamination techniques, typically under vacuum, as is conventional in the art. The encapsulated composite is then sandwiched between a front-plane and a back-plane. The encapsulant materials used in PV cells include ethylene vinyl acetate (EVA) copolymer resins, typically wherein the vinyl acetate component is in the range of from about 10 to about 35 wt %, preferably from about 15 to about 35 wt %, preferably from about 20 to about 35 wt %, preferably from about 25 to about 35 wt %, and preferably form about 28 to about 33 wt %. Suitable EVA encapsulating materials include commercially available Elvax® resins (DuPont, including grades PV1410 to PV1650Z). Other encapsulant materials include ionomer-based materials, i.e. polymers made up primarily of non-polar repeat units with a minor proportion (typically no more than about 15 wt %) of salt-containing units. Typical ionomers include thermoplastic carboxylate ionomers wherein the non-polar comonomers are selected from ethylene and styrene (preferably ethylene), and containing a minor proportion of salt-containing units such as metal salts (for instance, alkali metal or zinc salts) of methacrylic acid and/or acrylic acid. Exemplary ionomeric encapsulant materials are the copolymers of ethylene and methacrylic acid and/or acrylic acid partially or completely neutralised with alkali metals or zinc, for instance Surlyn® (DuPont; for instance grade 1702). Other encapsulant materials include polyvinylbutyral resins, also commercially available from DuPont (for instance the PV5200 series), and silicone resins (for instance, Dow Corning's PV-6100 series of optically clear silicone encapsulants). Other encapsulant materials include polyolefins, such as homopolymers and copolymers of ethylene, for instance copolymers with acrylates and/or methacrylates such as methacrylic acid and/or acrylic acid.

The films of the present invention are particularly suitable as, or as a layer (particularly the outermost layer) present in, the back-plane of a PV cell. The back-plane of the PV cell should exhibit good hydrolysis resistance. The back-plane should preferably exhibit good thermal dimensional stability. Poor dimensional stability can result in the cracking of the adjacent encapsulant material, and particularly during the elevated temperatures (and normally also low pressure) experienced during manufacture of the device. The back-plane should preferably also exhibit good UV-stability. Lack of UV-stability can manifest itself in a yellowing, hazing and cracking of the film on exposure to sunlight thereby decreasing the effective service lifetime of the PV cell.

The film of the present invention is also suitable for use in any environment in which hydrolytic stability is critical, for instance for a prolonged period in humid conditions at elevated temperatures, and in exterior applications. As used herein, the term "prolonged period in humid conditions at elevated temperatures" refers to the environmental conditions which the film experiences during use, for instance as a PV cell, and preferably as measured by an accelerated ageing test using the pressure cooker test described herein (121° C. and 100% relative humidity over a period of at least 80 hours, preferably at least 84 hours, and preferably at least 90 hours).

The film of the present invention may further be used in the manufacture of electronic or opto-electronic devices, such as electroluminescent (EL) display devices (particularly organic light emitting display (OLED) devices), electrophoretic displays (e-paper) and semiconductor devices (such as organic field effect transistors, thin film transistors and integrated circuits generally).

The polyester films disclosed herein as layer(s) in PV cells and other electronic devices allows the manufacture of such devices in a reel-to-reel process, thereby reducing cost.

According to a further aspect of the present invention, there is provided the use of titanium dioxide particles coated by an organic coating, as described herein, for increasing the hydrolysis resistance of an oriented polyester film, wherein said organic coating does not comprise or is not derived from a silane.

According to a further aspect of the present invention, there is provided a method of manufacturing an oriented polyester film comprising the steps of:
  extruding a layer of molten polyester;
  (ii) quenching the extrudate;
  (iii) stretching the quenched extrudate in one direction or in two mutually perpendicular directions; and
  (iv) heat-setting the film,
  characterised in that titanium dioxide particles coated by an organic coating, as described herein, are incorporated into the polyester prior to formation of the polyester into a film in an amount effective to increase the hydrolysis resistance of the polyester film, relative to a polyester film in which the titanium dioxide particles have not been coated by said organic coating, wherein said organic coating does not comprise or is not derived from a silane.

Preferably, the increase in the hydrolysis resistance is such that the ETB of the oriented polyester film is at least 10%, preferably at least 20%, preferably at least 30%, after accelerated ageing at 121° C. and 100% relative humidity for at least 80 hours, preferably at least 84 hours, and preferably at least 90 hours.

According to a further aspect of the present invention, there is provided the use of an oriented polyester film as described herein as a layer in a photovoltaic cell, said photovoltaic cell preferably comprising a front-plane, electrode layer(s), a photovoltaic-active layer, and a back-plane, particularly wherein said back-plane comprises said oriented polyester film. Thus, according to a further aspect of the present invention, there is provided the use of a film as defined herein as, or as a layer present in, a back-plane in a PV cell.

According to a further aspect of the present invention, there is provided a photovoltaic cell comprising a front-plane, electrode layer(s), photovoltaic-active layer(s), and a back-plane, wherein the front-plane and/or the back-plane comprises an oriented polyester film as defined herein, and particularly wherein the back-plane is or comprises an oriented polyester film as defined herein. In said photovoltaic cell, the electrode layer(s) and photovoltaic-active layer(s) are suitably coated in an encapsulant.

The oriented polyester film described herein is preferably the outermost layer in such a photovoltaic cell. Preferably the oriented polyester film in such a photovoltaic cell is an opaque or white film.

Property Measurement

The following analyses are used to characterize the films described herein:

(i) Transmission Optical Density (TOD) is measured using a Macbeth Densitometer TR 927 (obtained from Dent and Woods Ltd, Basingstoke, UK) in transmission mode.

(ii) Whiteness index is measured using a Colorgard System 2000, Model/45 (manufactured by Pacific Scientific) and the principles of ASTM D 313.

(iii) Intrinsic viscosity (in units of dL/g) of the polyester and polyester film is measured by solution viscometry in accordance with ASTM D5225-98(2003) on a Viscotek™ Y-501C Relative Viscometer (see, for instance, Hitchcock, Hammons & Yau in American Laboratory (August 1994) "The dual-capillary method for modern-day viscometry") by using a 0.5% by weight solution of polyester in o-chlorophenol at 25° C. and using the Billmeyer single-point method to calculate intrinsic viscosity:

$$\eta = 0.25\eta_{red} + 0.75(\ln \eta_{rel})/c$$

wherein:
  $\eta$=the intrinsic viscosity (in dL/g),
  $\eta_{rel}$=the relative viscosity,
  c=the concentration (in g/dL), &

$\eta_{red}$=reduced viscosity (in dL/g), which is equivalent to ($\eta_{rel}$−1)/c (also expressed as $\eta_{sp}$/c where $\eta_{sp}$ is the specific viscosity).

(iv) Hydrolysis resistance may be assessed by subjecting the film to treatment at 121° C. and 100% relative humidity for up to 100 hours (the "pressure cooker test" (PHT)). The samples are placed in a SMEG AVS 23L Pressure Cooker set at the aforementioned temperature and humidity for a fixed duration. The samples are allowed to dry for 24 hrs at room temperature and humidity before analysis. Properties relating to the aging of the polymer may then be measured at various time intervals. In particular, the elongation to break (ETB) is measured, as described below.

(v) Elongation to break is measured according to test method ASTM D882. Using a straight edge and a calibrated sample cutter (10 mm+\−0.5 mm) five strips (100 mm in length) of the film are cut along the machine direction. Each sample is tested using an Instron model 3111 materials test machine, using pneumatic action grips with rubber jaw faces.

Temperature (23° C.) and relative humidity (50%) are controlled. The crosshead speed (rate of separation) is 25 mm·min$^{-1}$. The strain rate is 50%. It is calculated by dividing the rate of separation by the initial distance between grips (sample length). The equipment records the elongation at break of each sample. The elongation to break ($\in_B$ (%)) is defined as:

$$\in_B(\%) = (\text{extension at break}/L_0) \times 100$$

where $L_0$ is the original length of the sample between grips.

(vi) Weatherability of the polyester film is tested according to ISO 4892-2.

(vii) Thermal shrinkage is assessed for film samples of dimensions 200 mm×10 mm which were cut in specific directions relative to the machine and transverse directions of the film and marked for visual measurement. The longer dimension of the sample (i.e. the 200 mm dimension) corresponds to the film direction for which shrinkage is being tested, i.e. for the assessment of shrinkage in the machine direction, the 200 mm dimension of the test sample is oriented along the machine direction of the film. After heating the specimen to the predetermined temperature of 150° C. (by placing in a heated oven at that temperature) and holding for an interval of 30 minutes, it was cooled to room temperature and its dimensions re-measured manually. The thermal shrinkage was calculated and expressed as a percentage of the original length.

(viii) Differential scanning calorimeter (DSC) scans are obtained using a Perkin Elmer DSC 7 instrument. Polyester film samples weighing 5 mg were encapsulated into a standard Perkin Elmer aluminium DSC crucible. The film and crucible were pressed flat to ensure that the film was partially constrained in order to minimise effects of relaxation of orientation during heating. The specimen was placed in the sample holder of the instrument and heated at 80° C. per minute from 30 to 300° C. to record the relevant trace. A dry, inert purge gas (nitrogen) was used. The temperature and heat flow axis of the DSC instrument were fully calibrated for the experimental conditions, i.e. for the heating rate and gas flow rate. The values for the peak temperatures, i.e. the endothermic high temperature peak (A) and endothermic low temperature peak (B), were taken as the maximum displacement above a baseline drawn from the onset of each endothermic melting process to the end of each endothermic melting process. Peak temperature measurements were derived using standard analysis procedures within the Perkin Elmer software. Precision and accuracy of the measurements was ±2° C.

(ix) The water content of titanium dioxide is measured by a Karl Fischer titration, preferably a coulometric Karl Fischer titration. Typically, the sample is heated in an oven upstream of the titration cell and the released water is transferred by a flow of dry carrier gas to the titration cell where it is determined by a Karl Fischer titration. Suitably, a Metrohm 768 KF Coulometer coupled to a Metrohm 768 KF Oven is used to conduct a coulometric Karl Fischer titration.

The invention is further illustrated by reference to the following examples. The examples are not intended to limit the scope of the invention as described above.

EXAMPLES

Example 1

A masterbatch was prepared by incorporating titanium dioxide coated with an alumina layer and an organic coating as defined hereinabove (Tioxide® TR28; average particle size 0.21 μm) into polyethylene terephthalate (PET; IV of 0.61). The TiO$_2$ content of the masterbatch was 40 wt %, based on the total weight of the composition.

A two-layer coextruded film was produced in which layer (A) was derived from the TiO$_2$ masterbatch and polyethylene terephthalate to provide a concentration of about 14 wt % TiO$_2$ by total weight of layer (A). The masterbatch was combined with the PET in the hopper of a twin-screw extruder (with vacuum to remove moisture) on a conventional film manufacturing line. Layer (B) was polyethylene terephthalate and 40% reclaim.

The two-layer film was extruded and cast using a standard melt coextrusion system. The coextrusion system was assembled using two independently operated extruders which fed separate supplies of polymeric melt to a standard coextrusion block or junction at which these streams were joined. From the coextrusion block, the melt-streams were transported to a conventional, flat film extrusion die which allowed the melt curtain to be cast from the common coextrusion die at 285° C., and then quenched in temperature onto a rotating, chilled metal drum. The cast film was collected at a process speed of about 17.8 m/min and was approximately 2135 in width. The cast extrudate was stretched in the direction of extrusion to approximately 3 times its original dimensions at a temperature of 86.5° C. The cooled stretched film was then passed into a stenter oven at a temperature of 102° C. where the film was dried and stretched in the sideways direction to approximately 3.97 times its original dimensions. Side-ways draw temperature was 125° C. The biaxially stretched film was heat-set at temperatures in the range of from 215 to 220° C.

The final thickness of the resulting white film was 50 μm, with layer (A) being 10 about μm and layer (B) being about 40 μm.

Example 2 (Comparative)

Example 2 corresponded to Example 1 except that the titanium dioxide was an alumina-coated rutile TiO$_2$ (Titanix® JR301 from Tayca Corporation; average particle size 0.30 μm) which did not comprise the organic coating described herein.

Example 3 (Comparative)

Example 1 was repeated using a further grade of alumina-coated TiO$_2$ which did not comprise the organic coating described herein.

The hydrolysis resistance of each of the films was then assessed by measuring its elongation to break before and after accelerated ageing, as defined herein, and the results shown in FIG. 1 (in which the x-axis is time (hours), and the y-axis is the ETB (%)). The film of Example 1 exhibited surprisingly superior hydrolysis resistance, compared to the similar films in which the titanium dioxide was not coated with the organic coating described herein.

Examples 4, 5, 6 and 7

A series of 50 μm mono-layer PET films was prepared with various grades of coated $TiO_2$ and without $TiO_2$, as follows:
Example 4: no $TiO_2$ (control)
Example 5: Tioxide® TR28 (invention)
Example 6: Ti-Puree R104 (DuPont; silanized alumina-coated rutile $TiO_2$; comparative)
Example 7: Ti-Puree R960 (DuPont; alumina- and silica-coated rutile $TiO_2$ with no organic coating; comparative)

Masterbatches containing each $TiO_2$ grade were prepared with 60% $TiO_2$ in PET. Film examples 5, 6 and 7 were made by combining the masterbatch with a PET base polymer in the hopper of a twin-screw extruder (with vacuum to remove moisture) on a conventional film manufacturing line to provide about 10.5 wt % $TiO_2$ in the final film.

$SiO_2$ was added via a 10% masterbatch to provide 2.3 wt % $SiO_2$ in the final film. A liquid hydrolysis stabiliser (Cardura® E10P; glycidyl ester of versatic acid; Hexion Speciality Chemicals) was metered into the extruder at about 8 ml per kg of the polymer and its inorganic additives. The addition of $TiO_2$ to an hydrolysis stabiliser-containing film is expected to decrease the hydrolysis stability of the film.

Figure 2:
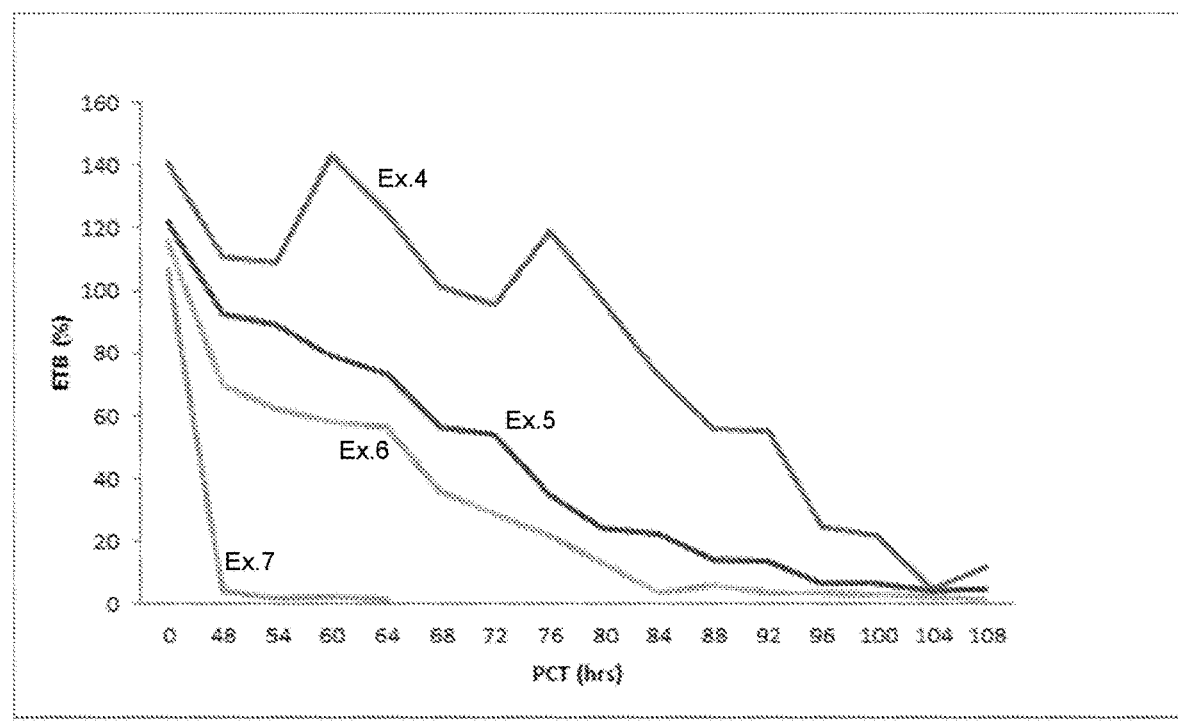

The films were then tested by measuring the elongation to break before and after accelerated ageing, as defined herein, and the results shown in FIG. 2 (in which the x-axis is time (hours), and the y-axis is the ETB (%)).The film of Example 5 exhibited surprisingly superior hydrolysis resistance, compared to the films of Examples 6 and 7 in which the titanium dioxide was not coated with an organic coating as defined in the present invention.

The invention claimed is:

1. A photovoltaic cell comprising a front-plane, electrode layer(s), photovoltaic-active layer(s), and a back-plane, wherein the front-plane and/or the back-plane comprises an oriented polyester film, wherein the oriented polyester film comprises titanium dioxide particles wherein said particles are coated by an organic coating which is an alkylphosphonic acid or an ester of the alkylphosphonic acid wherein the alkylphosphonic acid contains from 6 to 22 carbon atoms;
and wherein the oriented polyester film comprises said titanium dioxide particles in an amount of from about 5 wt % by total weight of the film, and
wherein the oriented polyester film does not comprise an additional organic hydrolysis stabiliser.

2. A photovoltaic cell according to claim 1, wherein the oriented polyester film comprises from about 5 wt % to about 40 wt %, preferably from about 5 wt % to about 20 wt %, of said titanium dioxide particles coated by said organic coating, by total weight of the film.

3. A photovoltaic cell according to claim 1, wherein said polyester film is a layer (A) in a multilayer film further comprising a second layer (B).

4. A photovoltaic cell according to claim 3, wherein said second layer (B) is a polyester film layer.

5. A photovoltaic cell according to claim 3, wherein the intrinsic viscosity of the polyester film is at least about 0.60, preferably at least about 0.64.

6. A photovoltaic cell according to claim 4, wherein the polyester of said second layer (B) is or comprises a polyester which is the same as the polyester of layer (A).

7. A photovoltaic cell according to claim 4, wherein polyester layer (A) comprises from about 5 wt % to about 40 wt %, preferably from about 5 wt % to about 20 wt %, preferably from about 10 wt % to about 20 wt %, of said titanium dioxide particles coated by said organic coating, by total weight of the layer.

8. A photovoltaic cell according to claim 4, wherein said second layer (B) comprises said titanium dioxide particles coated by said organic coating, preferably in an amount of from about 1 wt % to about 10 wt %, preferably from about 1 wt % to about 5 wt %, by total weight of the layer.

9. A photovoltaic cell according to claim 8, wherein the amount of said titanium dioxide particles coated by said organic coating in layer (A) is greater than the amount of titanium dioxide particles coated by said organic coating in layer (B).

10. A photovoltaic cell according to claim 4, wherein said second layer (B) comprises reclaimed waste film derived from the manufacture of said multilayer film.

11. A photovoltaic cell according to claim 4, wherein the thickness of layer (A) is less than the thickness of layer (B), preferably wherein the thickness of layer (A) is from about 10% to about 40%, preferably from about 20% to about 30%, of the thickness of layer (B).

12. A photovoltaic cell according to claim 1, wherein the total thickness of the oriented polyester film is from about 12 μm to about 500 μm, preferably from about 20 μm to about 100 μm.

13. A photovoltaic cell according to claim 1, wherein the oriented polyester film is a biaxially oriented polyester film.

14. A photovoltaic cell according to claim 1, wherein said polyester is selected from polyethylene terephthalate and polyethylene naphthalate, and is preferably from polyethylene terephthalate.

15. A photovoltaic cell according to claim 1, wherein the titanium dioxide is in the rutile crystal form.

16. A photovoltaic cell according to claim 1, wherein said titanium dioxide particles are uniformly and discretely coated by said organic coating.

17. A photovoltaic cell according to claim 1, wherein said coated titanium dioxide particles coated by an organic coating have a particle size of from about 0.01 μm to about 5.0 μm, preferably from about 0.10 μm to 0.40 μm.

18. A photovoltaic cell according to claim 1, wherein the film does not comprise an organic UV absorber.

19. A photovoltaic cell according to claim 1, wherein the film is white.

20. A photovoltaic cell according to claim 1, wherein the hydrolysis resistance of the polyester film is such that the Elongation To Break is at least 10%, preferably at least 20%, preferably at least 30%, after accelerated ageing at 121° C. and 100% relative humidity for at least 80 hours.

21. A photovoltaic cell according to claim 1, wherein said electrode layer(s) and photovoltaic-active layer(s) are coated in an encapsulant, and wherein the back-plane comprises the oriented polyester film.

22. A photovoltaic cell according to claim 1, wherein the organic coating comprises n-octylphosphonic acid, n-decylphosphonic acid, 2-ethylhexylphosphonic acid, camphyl phosphonic acid, and/or an ester thereof.

* * * * *

UNITED STATES PATENT AND TRADEMARK OFFICE
CERTIFICATE OF CORRECTION

PATENT NO. : 11,629,241 B2
APPLICATION NO. : 16/609421
DATED : April 18, 2023
INVENTOR(S) : Allan Lovatt et al.

Page 1 of 1

It is certified that error appears in the above-identified patent and that said Letters Patent is hereby corrected as shown below:

In the Claims

Column 18, Claim 14, Line 41, "and is preferably from polyethylene terephthalate." should be "and is preferably polyethylene terephthalate."

Signed and Sealed this
Twenty-seventh Day of June, 2023

Katherine Kelly Vidal
*Director of the United States Patent and Trademark Office*